(12) United States Patent
Richard et al.

(10) Patent No.: US 7,071,409 B2
(45) Date of Patent: Jul. 4, 2006

(54) ELECTRICAL ENCLOSURE HAVING IMPROVED SEALING AND SHIELDING COMPONENT AND METHOD OF MANUFACTURE THEREOF

(75) Inventors: John Emil Richard, Rogers, MN (US); William Joseph Nepsha, Blaine, MN (US); Timothy Lloyd Mullen, Hudson, WI (US); Thomas R. Hurney, Anoka, MN (US); Paul Rutherford, Jr., Straubenhardt (DE); Tom Erickson, Plymouth, MN (US); Chuck Lavigne, Cedar, MN (US); Thomas E. Anderson, Coon Rapids, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 10/356,724

(22) Filed: Jan. 31, 2003

(65) Prior Publication Data

US 2004/0012932 A1    Jan. 22, 2004

Related U.S. Application Data

(60) Continuation of application No. 10/178,701, filed on Jun. 24, 2002, now abandoned, which is a continuation-in-part of application No. 09/795,597, filed on Feb. 28, 2001, now Pat. No. 6,408,506, which is a division of application No. 09/036,150, filed on Mar. 6, 1998, now Pat. No. 6,188,014.

(51) Int. Cl.
*H02G 3/08* (2006.01)

(52) U.S. Cl. ............... 174/35 GC; 174/35 MS; 174/35 R; 29/592.1; 361/424; 361/724; 277/227

(58) Field of Classification Search .......... 174/35 GC, 174/35 R, 35 MS; 29/592.1; 361/424, 724; 277/227
See application file for complete search history.

(56) References Cited

U.S. PATENT DOCUMENTS 3,299,574 A    1/1967    Alexeff et al.

(Continued)

FOREIGN PATENT DOCUMENTS

CA           658663       2/1963

(Continued)

OTHER PUBLICATIONS

Chomerics Engineering Handbook, "EMI Shielding for Military/Aerospace Electronics," 3 pages (Sep. 1996).

(Continued)

*Primary Examiner*—Dean A. Reichard
*Assistant Examiner*—Anton Harris
(74) *Attorney, Agent, or Firm*—Merchant & Gould P.C.

(57) ABSTRACT

An electrical enclosure having an improved sealing and shielding component and a method of manufacturing such an enclosure is provided. In accordance with an embodiment of the invention, a wire mesh is positioned against the surface of the enclosure. While the wire mesh is being positioned against the enclosure surface, a foam is formed on the enclosure surface adjacent the wire mesh. The foam generally adheres to the enclosure surface and holds the wire mesh in place. In accordance with one aspect of the invention, the foam has a height equal to or greater than the height of the wire mesh. The improved sealing and shielding components can, for example, improve the sealing and shielding of the electrical enclosure as compared to conventional electrical enclosures. The present electrical enclosure may, for example, also reduce the cost of manufacturing electrical enclosures.

18 Claims, 6 Drawing Sheets

U.S. PATENT DOCUMENTS

| | | | |
|---|---|---|---|
| 4,857,668 A | | 8/1989 | Buonanno |
| 4,900,877 A | | 2/1990 | Dubrow et al. |
| 5,028,739 A | | 7/1991 | Keyser et al. |
| 5,032,689 A | * | 7/1991 | Halligan et al. .......... 174/35 R |
| 5,045,635 A | * | 9/1991 | Kaplo et al. ........... 174/35 GC |
| 5,115,104 A | * | 5/1992 | Bunyan ................. 174/35 GC |
| 5,134,244 A | | 7/1992 | Balsells |
| 5,142,101 A | | 8/1992 | Matsuzaki et al. |
| 5,216,840 A | | 6/1993 | Andrews |
| 5,465,528 A | | 11/1995 | Schinzel et al. |
| 5,597,979 A | * | 1/1997 | Courtney et al. ......... 174/35 R |
| 5,804,762 A | | 9/1998 | Jones et al. |
| 5,889,229 A | | 3/1999 | Sosnowski |
| 5,902,956 A | | 5/1999 | Spies et al. |
| 6,188,014 B1 | | 2/2001 | Richard et al. |
| 6,211,458 B1 | | 4/2001 | Mitchell et al. |
| 6,408,506 B1 | | 6/2002 | Richard et al. |

FOREIGN PATENT DOCUMENTS

| | | |
|---|---|---|
| EP | 0 275 171 A2 | 7/1988 |
| GB | 2 291 938 A | 7/1996 |
| GB | 2 304 467 A | 3/1997 |

OTHER PUBLICATIONS

Duosil®, "Composite Wire Mesh And Silicone Or Fluorosilicone Rubber Strip," p. A-19 (1995).

* cited by examiner

ELECTRICAL ENCLOSURE HAVING IMPROVED SEALING AND SHIELDING COMPONENT AND METHOD OF MANUFACTURE THEREOF

This application is a Continuation of application Ser. No. 10/178,701 filed Jun. 24, 2002 now abandoned, which is a Continuation In Part of U.S. patent application Ser. No. 09/795,597 filed Feb. 28, 2001, issued as U.S. Pat. No. 6,408,506, which is a Divisional of U.S. patent application Ser. No. 09/036,150 filed Mar. 6, 1998, now issued as U.S. Pat. No. 6,188,014.

FIELD OF THE INVENTION

The present invention is generally directed to electrical enclosures and, more particularly, to an electrical enclosure having improved sealing and shielding and a method of manufacturing such an electrical enclosure.

BACKGROUND OF THE INVENTION

Electrical enclosures are widely-used to house electrical components, such as switches. A typical electrical enclosure is a steel structure that includes a base structure and a removable structure, such as a door or cover. The base structure and removable structure are generally secured together in order to form the enclosure that houses the electrical components. One important characteristic of an electrical enclosure is its ability to effectively electromagnetically shield the enclosed components. Another important feature is the enclosures ability to seal the housed electrical components from external conditions, such as dust, rain, snow, ice, etc.

Figure 1:
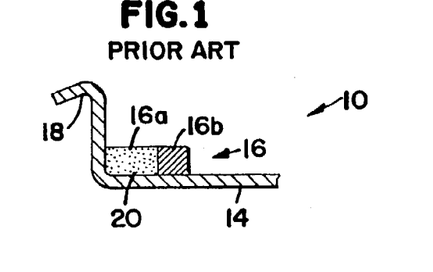
FIG. 1 shows a cross-sectional view of a conventional electrical enclosure.

In conventional electrical enclosures, the electrical enclosure is sealed and electromagnetically shielded using a preformed rubber gasket/wire mesh assembly (hereinafter preformed gasket/mesh assembly). A cross section of a conventional enclosure employing a preformed gasket/mesh assembly is shown in FIG. 1. The enclosure generally designated 10 includes a base structure 12 (shown in phantom) and a cover 14. A preformed gasket/mesh assembly 16 is disposed against an outer lip 18 of the cover 14. Typically the gasket/mesh assembly 16 runs adjacent the outer lip 18 about the entire perimeter of the cover 14. The preformed gasket/mesh assembly 16 typically includes a rubber gasket 16a bonded to a wire mesh 16b. The wire mesh 16b typically has a height "h" which is equal to or greater than the height of the rubber gasket 16a. In manufacturing the enclosure 10, an adhesive 20 is typically applied to the bottom of the rubber gasket 16a and the preformed gasket/mesh assembly 16 is laid down by hand against the outer lip 18 of the cover 14.

Conventional electrical enclosures such as those exemplified by FIG. 1 are typically associated with a number of shortcomings. For example, these conventional electrical enclosures often fail to adequately seal the enclosed electrical components under more harsh weather conditions. In addition, the assembling of conventional electrical enclosures is typically expensive. Much of the high cost stems from the labor intensive manufacturing process used to adhere the preformed gasket/mesh assembly to the electrical enclosure. The present invention addresses these problems and others associated with shielding and sealing of electrical enclosures.

SUMMARY OF THE INVENTION

The present invention generally provides an electrical enclosure having improved sealing and shielding and a method of manufacturing such an enclosure. The improved sealing and shielding component can, for example, improve the sealing of the electrical enclosure as compared to conventional electrical enclosures. The present electrical enclosure may, for example, also reduce the cost of manufacturing electrical enclosures, particularly the labor costs of installing seals and shielding.

In accordance with one embodiment of the invention, a method of manufacturing an electrical enclosure is provided. Consistent with this method, a wire mesh is positioned against the surface of the enclosure. While the wire mesh is positioned against the enclosure surface, a foam is formed on the enclosure surface adjacent the wire mesh. The foam generally adheres to the enclosure surface and holds the wire mesh in place. In accordance with one aspect of the invention, the foam has a height equal to or greater than the height of the wire mesh.

An electrical enclosure, consistent with a first embodiment of the invention, includes a structure having a base surface with a perimeter and an edge around the perimeter. The enclosure further includes a wire mesh disposed on the base surface, the wire mesh being disposed apart from the edge of the structure so as to form a channel between the wire mesh and the edge. An expanding foam material is disposed in the channel and over a part of the wire mesh and may extend into a portion of the interlocking mesh. The foam adheres to the base surface and holds the wire mesh in place. The electrical enclosure structure may, for example, be a cover of the electrical enclosure. In accordance with another aspect of the invention, the foam has a height that is greater than the height of the wire mesh.

In another embodiment, a combined mesh and gasket assembly having a flexible gasket and wire mesh with an adhesive on the gasket portion is positioned against the base surface. A spacer member may be utilized during installation to position the mesh and gasket assembly at the desired location. The spacer is positioned against a lip of the enclosure and the combined mesh and gasket assembly is placed against the spacer. When the spacer is removed, the edge of the enclosure and the mesh portion form a channel. The adhesive adheres to the base surface of the enclosure, holding the combination mesh and gasket assembly in position. Expandable foam is then disposed in the channel and expands. The foam may expand so as to be higher than the wire mesh, with the foam adhering to the base surface and the edge and extending into the wire mesh, through the openings and around the wires of the mesh to form a mechanical bond with the wires of the mesh. The expanded foam adheres to the base surface and the lip and holds the combination mesh and gasket element in place.

These features of novelty and various other advantages that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is generally directed to an electrical enclosure and in particular is directed to an electrical enclosure that employ a sealing and shielding component. While the present invention is not so limited, a more detailed understanding of the present invention will be gained through a discussion of the drawings in connection with the examples provided below.

Figure 2:
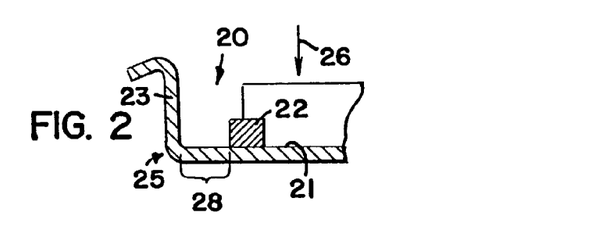
FIG. 2 shows a sectional view of a first embodiment of an enclosure according to the principles of the present invention with a wire mesh placed against the enclosure and a fixture engaging the wire mesh.
Figure 4:
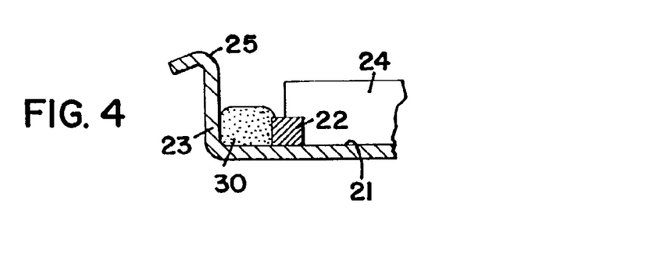
FIG. 4 shows a sectional view of the enclosure of FIG. 9 with the foam expanded.
Figure 5:
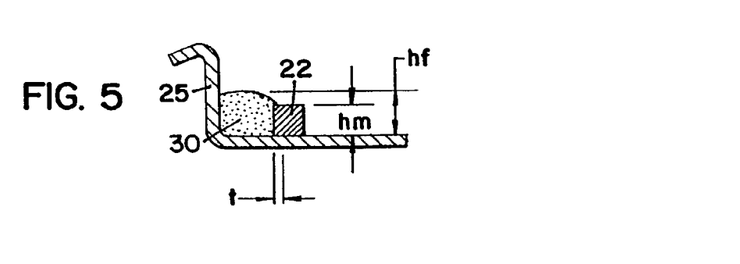
FIG. 5 shows a sectional view of the enclosure of FIG. 9 with the foam expanded and the fixture removed.
Figure 6:
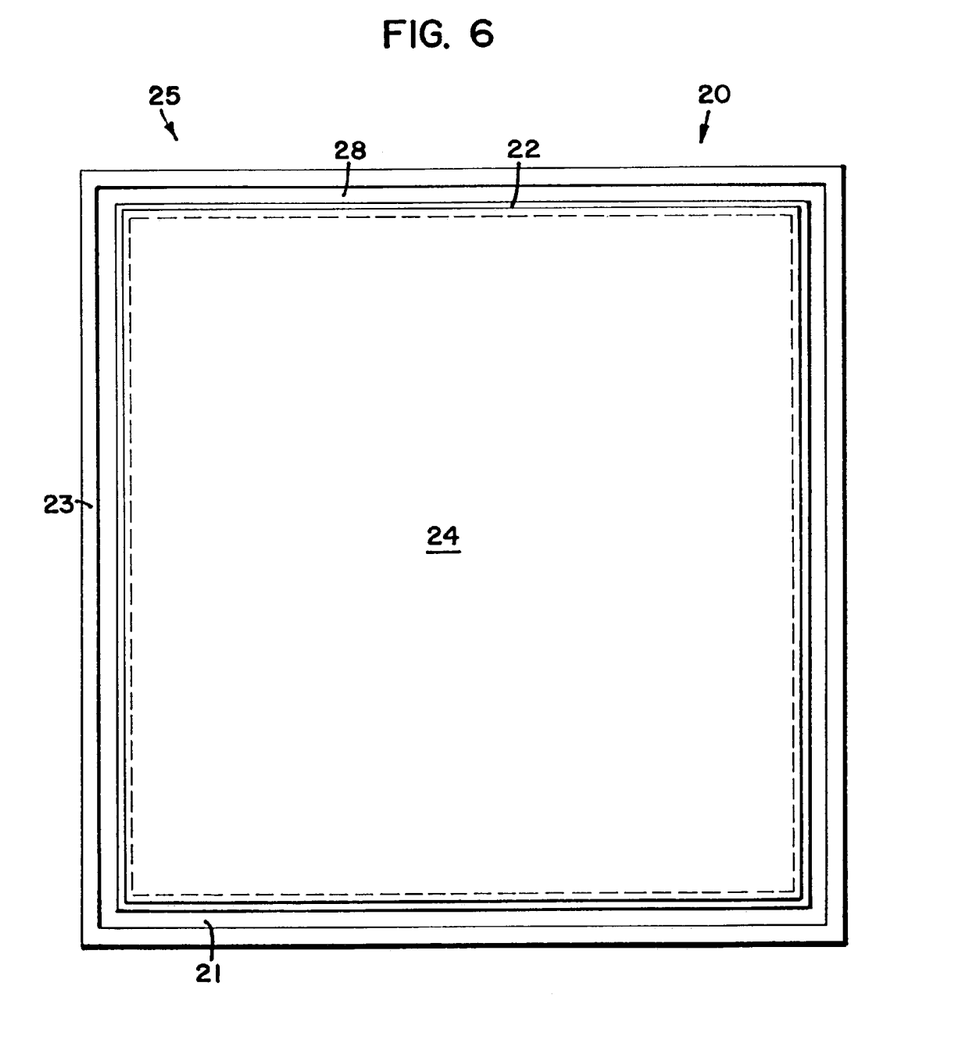
FIG. 6 shows a top plan view of the enclosure of FIG. 2.

FIGS. 2–7 illustrate an exemplary process for manufacturing an electrical enclosure having an improved sealing and shielding component in accordance with one embodiment of the invention. As shown in FIGS. 2 and 6, a wire mesh 22 is positioned against a base surface 21 of a structure 25 of an electrical enclosure 20. The enclosure structure 25 may be formed of a number of different materials including, for example, sheet metal, stainless steel, composite alloys, etc. While the present invention is not so limited, the structure 25 may, for example, be a cover for the electrical enclosure 20. The cross-section of the wire mesh 22 can vary and may, for example, be square (as shown in FIG. 2), rectangular, circular, etc. The wire mesh 22 may, for example, be formed by wrapping a sheet of wire mesh about itself. The interlocking wire pattern of the wire mesh can vary and may be square or hexagonal, for example.

The wire mesh 22 is typically positioned around the base surface 21 and apart from an outer edge 23 of the enclosure structure 25. This positioning provides a channel 28 between the outer edge 23 and the wire mesh 22. The wire mesh 22 may be positioned against the surface 21 in a number of different manners. In the illustrated embodiment, the wire mesh 22 is positioned against the base surface 21 by applying a downward force 26 on a fixture 24. The fixture 24 may, for example, be a plate that is sized to contact the wire mesh 22 while providing access from above to the channel 28. Suitable fixture plates may be formed from a number of different materials including metal. In some cases, the fixture 24 may include a fastening surface, such as barbs, Velcro™ hooks, or a magnetic surface disposed to contact the wire mesh 22 for facilitating the holding of the wire mesh relative to the fixture 24 and between the base surface 21 and the fixture 24.

Figure 3:
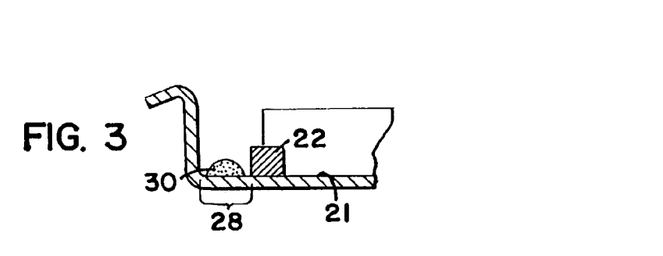
FIG. 3 shows a sectional view of the enclosure of FIG. 2 with an expandable foam placed in a channel between the wire mesh and enclosure lip.
Figure 7:
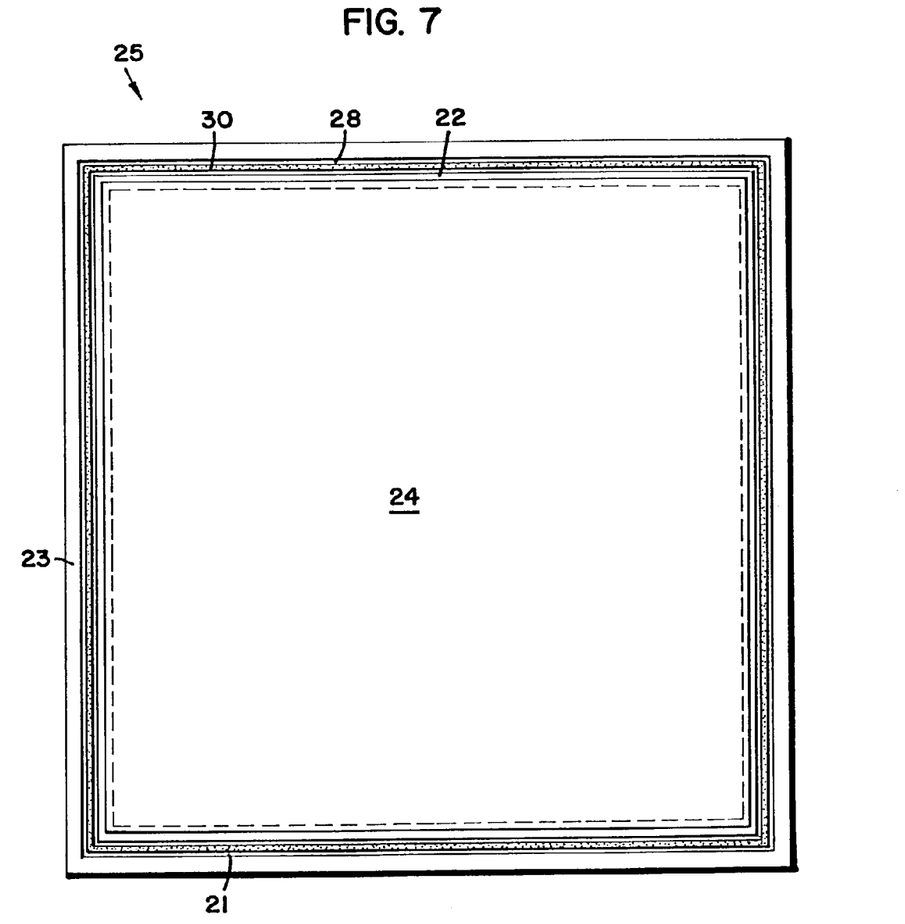
FIG. 7 shows a top plan view of the enclosure of FIG. 3.

While positioning the wire mesh 22 against the base surface 21, an initial volume of foam 30 is applied in the channel 28. The resultant structure is illustrated in FIGS. 3 and 7. The foam 30 may be applied (e.g., poured or dispensed) using, for example, well-known foam-in-place (FIP) techniques. The foam 30 is generally applied around the entire channel 28 and will be used to seal the interior of the electrical enclosure from external conditions. The foam 30 expands as will be discussed more fully below. The initial volume of the foam 30 is suitably selected in consideration of the desired final volume of the foam and can vary with the type of foam and its expansion characteristics. The final volume of the foam may be selected to provide the foam 30 with a height that is greater than the height of the wire mesh 22, as will be discussed more fully below. Suitable foam materials include polyurethane, for example.

Prior to applying the foam 30, the enclosure structure 25 may be conditioned to prepare the structure for adhering to the foam 30. The particular type of conditioning and the timing of the conditioning can vary depending on the material of the enclosure structure 25 as well as the type of conditioning used. In one embodiment, the enclosure structure 25 is conditioned by roughening surface portions of the enclosure structure 25. The roughened surface portions typically include part or the entire base surface 21 in the channel 28. The roughened surface portions may further include portions of the base surface 21 outside of the channel 28 (e.g., surface portions under the wire mesh 22 or portions of the inner surface of the edge 23). The roughening may be done using, for example, a well-known abrasion technique. Moreover, roughening of the enclosure structure 25 may be done before or after pressing the wire mesh 22 against the base surface 21. In another embodiment, a primer is applied to the enclosure structure 25 to prepare the enclosure structure 25 for adhering to the foam 30. The primer may be applied before or after the wire mesh 22 has been positioned against the base surface 21. Generally, the primer is applied to the part or the entire base surface 21 in the channel 28 and may also be applied on the inner surface of the outer edge 23.

While the wire mesh 22 remains positioned against the base surface 21, the foam 30 is allowed to expand. The resultant structure is illustrated in FIG. 4. As the foam 30 expands it generally presses against the wire mesh 22 and the outer edge 23 of the enclosure structure 25 and grows upward above the wire mesh 22. During this process, the foam 30 adheres to the base surface 21 as well as the outer edge 23. In addition, the foam 30 forms a bond with the wire mesh 22. In some embodiments, the foam 30 may expand through the openings and around the wires in the interlocking wire mesh 22 to form a mechanical bond. Where the wire mesh 22 is denser, the foam may simply expand a short distance into the wire mesh 22 to form the bond.

The expanding time for the foam 30 while the wire mesh 22 is positioned is generally selected to allow the foam 30 to fully expand to a final volume. The invention however is not so limited. The foam 30 may, if desired, only be allowed to partially expand while the fixture 24 is in place. What is important is that the final foam product adheres to the base surface 21 and holds the wire mesh 22 and provides a desired height relative to the wire mesh 22. In the example embodiment, the foam 30 is allowed to expand to near or at its final volume with the fixture 24 in place. The length of time that the foam 30 is allowed to expand while the wire mesh 22 is positioned can vary depending on the type of foam used as well as the ambient conditions. Suitable expansion times range from about 15 to 30 minutes, and more typically about 20 minutes, for many applications.

The fixture 24 is then removed. The resultant structure is illustrated in FIG. 5. After removing the fixture 24, some additional expansion of the foam 30 may follow in cases where the foam has not fully expanded. During the expansion process, a portion of the foam 30 may expand over the wire mesh 22. The amount t by which the foam 30 overlaps the wire mesh 22 can vary depending on the amount of expansion of the foam 30. The foam 30 may, for example, overlap the wire mesh 22 by an amount t ranging from about 0.01 to 0.05 inches.

The final height $h_f$ of the foam 30 is typically selected to provide adequate sealing depending on the conditions under which the electrical enclosure 20 is to be used. Generally the final height $h_f$ of the foam 30 is greater than or equal to the height $h_m$ of the wire mesh 22. The final foam height $h_f$ may, for example, exceed the wire mesh height $h_m$ by about 10 to 40%. In a particular embodiment, the final foam height $h_f$ exceeds the wire mesh height $h_m$ by about 15%.

The structure illustrated in FIG. 5 is also illustrative of the enclosure structure 25 prior to being secured to a second enclosure structure (e.g., a base structure of the enclosure housing electrical components). The illustrated structure of FIG. 5 generally includes the foam 30 and wire mesh 22 which together form a sealing and shielding component of the electrical enclosure 20.

Figure 8:
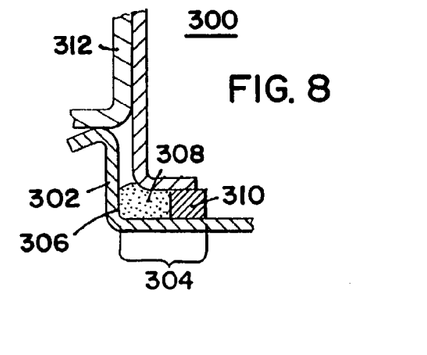
FIG. 8 is a partial sectional view of an exemplary electrical enclosure in accordance with another embodiment of the invention.

Turning now to FIG. 8, there is illustrated a partial cross-sectional view of an exemplary electrical enclosure 300 incorporating an improved sealing and shielding component in accordance with one embodiment of the invention. The electrical enclosure 300 generally includes a cover piece 302 having a sealing and shielding component 304 adjacent an outer edge 306 of the cover piece 302. The sealing and shielding component 304 generally includes a foam 308 and a wire mesh 310 which are formed in a similar manner as discussed above with respect to FIGS. 2–5. The electrical enclosure 300 further includes a base structure 312 that is shown securely attached to the cover piece 302. When the base structure 312 and cover piece 302 are securely attached, the foam 308 compresses to allow both the cover piece 302 and the base structure 312 to electrically contact the wire mesh 310, thereby providing an electromagnetic shield of enclosed electrical components (not shown), and to allow the cover piece 302 and base structure 312 to compress the foam 308, thereby providing a tight seal between the two enclosure structures 302 and 312.

Figure 9:
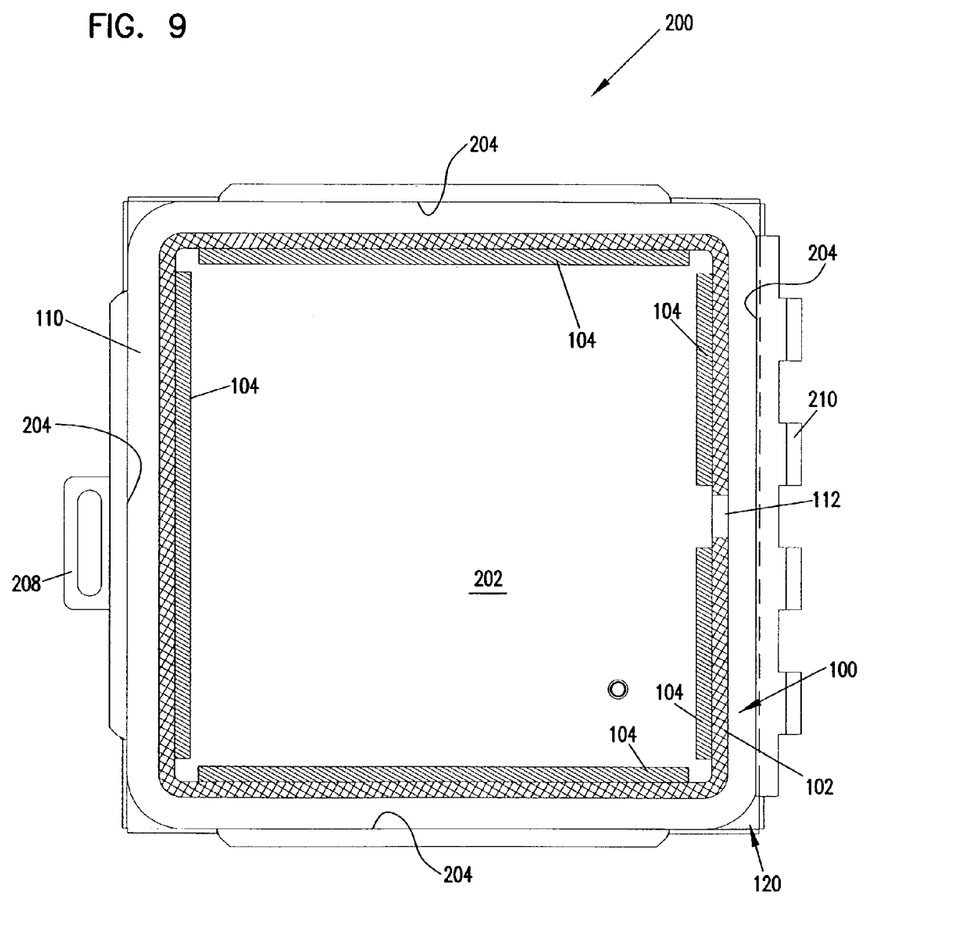
FIG. 9 shows a top plan view of another alternate embodiment of an electrical enclosure door with a seal according to the principles of the present invention.

Referring now to FIGS. 9–13, there is shown another embodiment of the apparatus and method of the present invention for shielding and sealing an electrical enclosure. The electrical enclosure, generally designated 200 includes a base surface 202 and an outer edge or a lip 204. The sealing may occur against a box-like electrical enclosure housing or against the door portion, as shown in FIG. 9. When the sealing system of the present invention is utilized with the door of the example enclosure 200, there may be included a handle 208 and a hinge portion 210.

Figure 10:
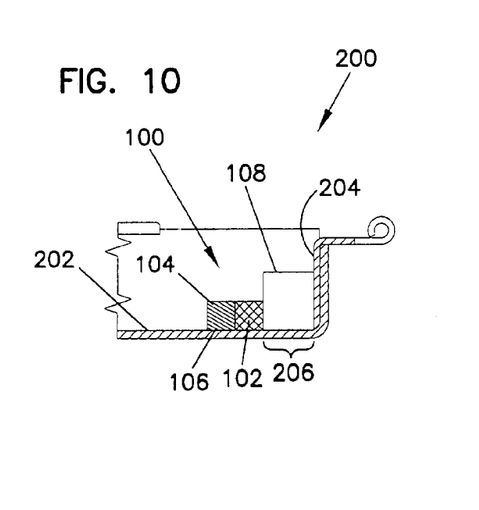
FIG. 10 shows a sectional view of the enclosure of FIG. 9 with a combination wire mesh-neoprene gasket element and a spacer member positioned against the enclosure.
Figure 13:
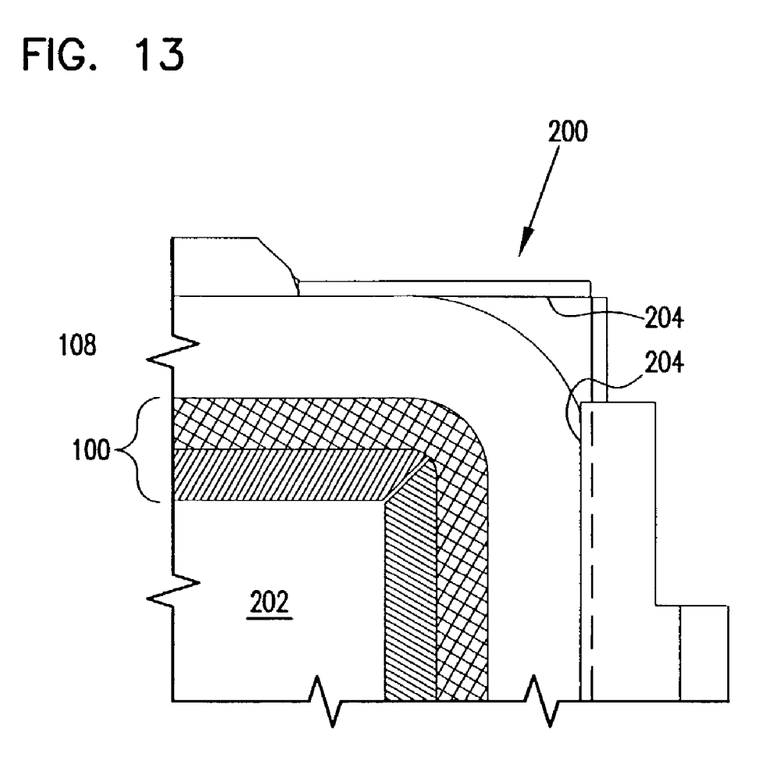
FIG. 13 shows a detail view of a corner of the a further alternate embodiment of a seal for the enclosure according to the principles of the present invention.

Referring now to FIG. 10, in the embodiment shown, a combination gasket and mesh assembly 100 is placed against the base surface 202 with a spacer member 108 inserted between the sealing and shielding member 100 and the edge 204. The gasket and mesh assembly 100 includes the wire mesh portion as well as a flexible gasket portion 104. The spacer member 108 is generally placed in the lower corner of the enclosure 200 so it abuts both the base surface 202 and the edge 204. When the spacer 108 has been positioned as shown, the gasket and mesh assembly 100 may be placed at the desired location with the mesh portion 102 abutting the spacer member 108. The gasket and mesh assembly 100 is generally formed in a roll or length so that it may be placed continuously around the enclosure 200. The wire mesh portion 102 generally includes a wire mesh with interlocking wire members while the gasket portion 104 is typically made of neoprene or similar flexible material providing superior flexibility and sealing capabilities. The gasket portion 104 includes an adhesive 106 along one side so that as the gasket and mesh assembly 100 is placed on the enclosure surface 202, the assembly 100 is held in place as the adhesive 106 adheres to the base surface 202. To provide proper positioning, the ends of the length of the gasket and mesh assembly 100 are joined by a shrink tube or other suitable connector 112. In some applications, portions of the gasket portion 104, such as corners, may be removed to provide better engagement with the enclosure 200, as shown in FIG. 9. Alternatively, as shown in FIG. 13, the corners may be left with the gasket portion 104 forming a flexible portion that does not have gaps, as may be utilized with the enclosure 200 shown in FIG. 9.

Figure 11:
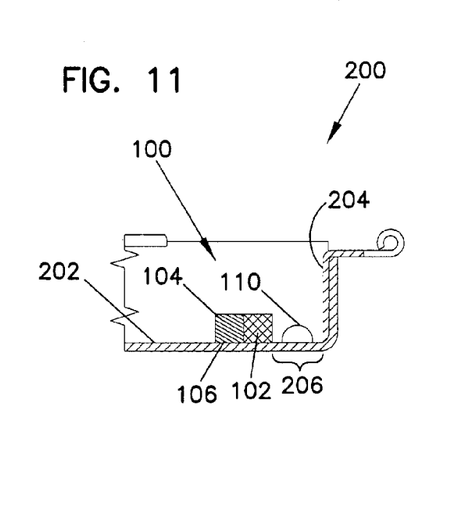
FIG. 11 shows a sectional view of the enclosure of FIG. 9 with an expandable foam placed in a channel between the wire mesh and enclosure lip.

Referring now to FIG. 11, when the gasket and mesh assembly 100 has been positioned and the adhesive 106 is adhered to the base surface 202, the spacer 108 is removed. This forms a channel 206 intermediate the mesh portion 102 and the edge 204. An expandable foam 110 is then placed in the channel 206, as shown in FIG. 11. As with the embodiment shown in FIGS. 2–8, the foam 110 will expand and may expand above the shielding and sealing element 100.

Figure 12:
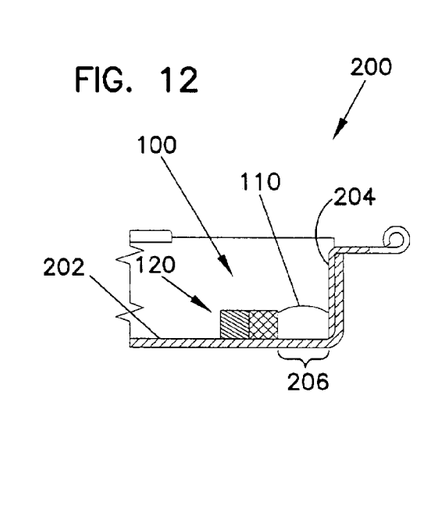
FIG. 12 shows a sectional view of the enclosure of FIG. 9 with the foam expanded.

As shown in FIG. 12, the expandable foam 110 expands to fill the entire channel 206. The expandable foam 110 expands to engage the mesh portion 102. The foam 110 may expand into the openings and around the wires of the mesh portion 102 to form a mechanical bond with the interlocking wires of the mesh and to hold the gasket and mesh assembly 100 in position. The expandable foam 110 is allowed to cure so that when completed, a sealing and shielding assembly 120 that includes the expanded foam 110 bonded to the gasket and mesh assembly 100, providing a desired seal against the base surface 202 and edge 204 and electromagnetic shielding from the wire mesh 102. Improved adherence to the enclosure 200 is obtained by the foam 110 holding the shielding and sealing structure 120 to the enclosure 200 with the adhesive 106 also providing additional attachment. The enclosure surface 202 may be roughened and treated with a primer to enhance adherence of the shielding and sealing assembly 120. It can be appreciated that with the embodiment and method shown in FIGS. 9–13, no fixture is required during the placement of the foam 110 and subsequent expansion and curing.

It can be appreciated that the various embodiments may be utilized in various locations throughout an electrical enclosure. For example, the embodiment and method shown in FIGS. 9–13 may be utilized with the enclosure portion rather than a cover or door and may also be positioned, as shown in FIG. 8.

Using the above process, an electrical enclosure having an improved sealing and shielding component may be formed. This provides an electrical enclosure having an improved sealing capability as compared to conventional electrical enclosures. In addition, this can, for example, provide more cost efficient assembly of the electrical enclosure as compared to conventionally manufactured electrical enclosures.

As noted above, the present invention is applicable to a number of different electrical enclosures that employ a sealing and shielding component. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. An electrical enclosure, comprising:
   a structure having a base surface and an edge around the base surface;
   a gasket assembly disposed on the base surface and around an inner space to form a flange on the base surface, comprising a wire mesh portion having interlocking wires defining a multiplicity of openings and a flexible gasket portion, wherein the gasket assembly is disposed apart from the edge forming a channel between the gasket assembly and the edge; and
   a foam disposed in the channel and adhering to the base surface and the edge and extending into the wire mesh, through the openings and around the wires of the mesh forming mechanical bond with the wires of the mesh and holding the gasket assembly, wherein the foam forms a sealing element.

2. An electrical enclosure according to claim 1, wherein the flexible gasket portion comprises an adhesive and wherein the flexible gasket portion is adhered to the base surface.

3. An electrical enclosure according to claim 1, wherein the flexible gasket portion comprises neoprene.

4. An electrical enclosure according to claim 1, wherein the gasket assembly comprises a length of the wire mesh portion and the flexible gasket portion.

5. The electrical enclosure of claim 1, wherein the structure is a cover of the electrical enclosure.

6. The electrical enclosure of claim 1, wherein the foam has a height at least equal to a height of the wire mesh.

7. The electrical enclosure of claim 6, wherein the foam height is greater then the height of the wire mesh.

8. The electrical enclosure of claim 1, wherein the foam comprises an expanded foam.

9. A sealed enclosure, comprising:
   an enclosure structure with a base surface and an outer lip about a perimeter of the base surface;
   an elongate gasket assembly defining a flange extending from the base surface, the gasket assembly having a wire mesh portion having interlocking wires defining a multiplicity of openings and a flexible portion, wherein the gasket assembly is positioned against the base surface, wherein a channel is defined between the wire mesh portion and the outer lip of the enclosure structure;
   an expanded foam placed in the channel; wherein the foam is adhered to the base surface and extends into the wire mesh portion, through the openings and around the wires of the mesh to form a mechanical bond with the wires of the mesh, holding the wire mesh in position, and forming a sealing element.

10. An electrical enclosure according to claim 9, wherein the flexible portion comprises an adhesive and wherein the flexible portion is adhered to the base surface spaced apart from the outer lip.

11. An electrical enclosure according to claim 9, wherein the flexible portion comprises neoprene.

12. An electrical enclosure according to claim 9, wherein the gasket assembly comprises a length of the wire mesh portion and flexible portion.

13. The enclosure of claim 9, further including a primer covering at least part of the base surface beneath the foam.

14. The enclosure of claim 9, wherein at least part of the enclosure surface is roughened beneath the foam.

15. The enclosure of claim 9, wherein the expanded foam adheres directly to the base surface.

16. The enclosure of claim 15, wherein the expanded foam comprises an adhering exterior surface.

17. A sealing system for an electrical enclosure having a base surface and an edge surface extending up from the base surface, comprising:
   a gasket assembly having a length of a wire mesh portion proximate a length of a gasket material portion, the gasket material portion having an adhesive and a removable strip, wherein the adhesive engages the base surface;
   a removable spacer member inserted against the base surface and the edge surface and engaging a first side of the gasket assembly;
   an expandable foam disposed on the base surface on a second side of the gasket assembly and expanded into the wire mesh portion.

18. The enclosure of claim 9, wherein the wire mesh portion comprises a compressible mesh.

* * * * *